(12) United States Patent
Kavipurapu

(10) Patent No.: US 6,584,546 B2
(45) Date of Patent: Jun. 24, 2003

(54) HIGHLY EFFICIENT DESIGN OF STORAGE ARRAY FOR USE IN FIRST AND SECOND CACHE SPACES AND MEMORY SUBSYSTEMS

(76) Inventor: Gautam Nag Kavipurapu, 7750 N. MacArthus, Irving, TX (US) 75063

( * ) Notice: Subject to any disclaimer, the term of this patent is extended or adjusted under 35 U.S.C. 154(b) by 58 days.

(21) Appl. No.: 09/761,068

(22) Filed: Jan. 16, 2001

(65) Prior Publication Data

US 2002/0095552 A1 Jul. 18, 2002

(51) Int. Cl.$^7$ .............................................. G06F 12/00
(52) U.S. Cl. ........................ 711/120; 711/168; 711/133
(58) Field of Search ................................ 711/119, 122, 711/133, 136, 120, 168, 169

(56) References Cited

U.S. PATENT DOCUMENTS

| | | | | |
|---|---|---|---|---|
| 5,386,547 A | * | 1/1995 | Jouppi ........................ 711/122 |
| 5,581,725 A | * | 12/1996 | Nakayama ................... 711/117 |
| 5,689,679 A | * | 11/1997 | Jouppi ........................ 711/122 |
| 5,787,478 A | * | 7/1998 | Hicks et al. ................. 711/122 |
| 6,078,992 A | * | 6/2000 | Hum ........................... 711/120 |
| 6,253,291 B1 | * | 6/2001 | Pong et al. .................. 711/146 |
| 6,321,297 B1 | * | 11/2001 | Shamanna et al. ............ 710/52 |

* cited by examiner

*Primary Examiner*—Hong C Kim
(74) *Attorney, Agent, or Firm*—James J. Murphy, Esq.; Winstead Sechrest & Minick, P.C.

(57) ABSTRACT

A method of operating a cache memory includes the step of storing a set of data in a first space in a cache memory, a set of data associated with a set of tags. A subset of the set of data is stored in a second space in the cache memory, the subset of the set of data associated with a tag of a subset of the set of tags. The tag portion of an address is compared with the subset of data in the second space in the cache memory in that said subset of data is read when the tag portion of the address and the tag associated with the subset of data match. The tag portion of the address is compared with the set of tags associated with the set of data in the first space in cache memory and the set of data in the first space is read when the tag portion of the address matches one of the sets of tags associated with the set of data in the first space and the tag portion of the address and the tag associated with the subset of data in the second space do not match.

16 Claims, 5 Drawing Sheets

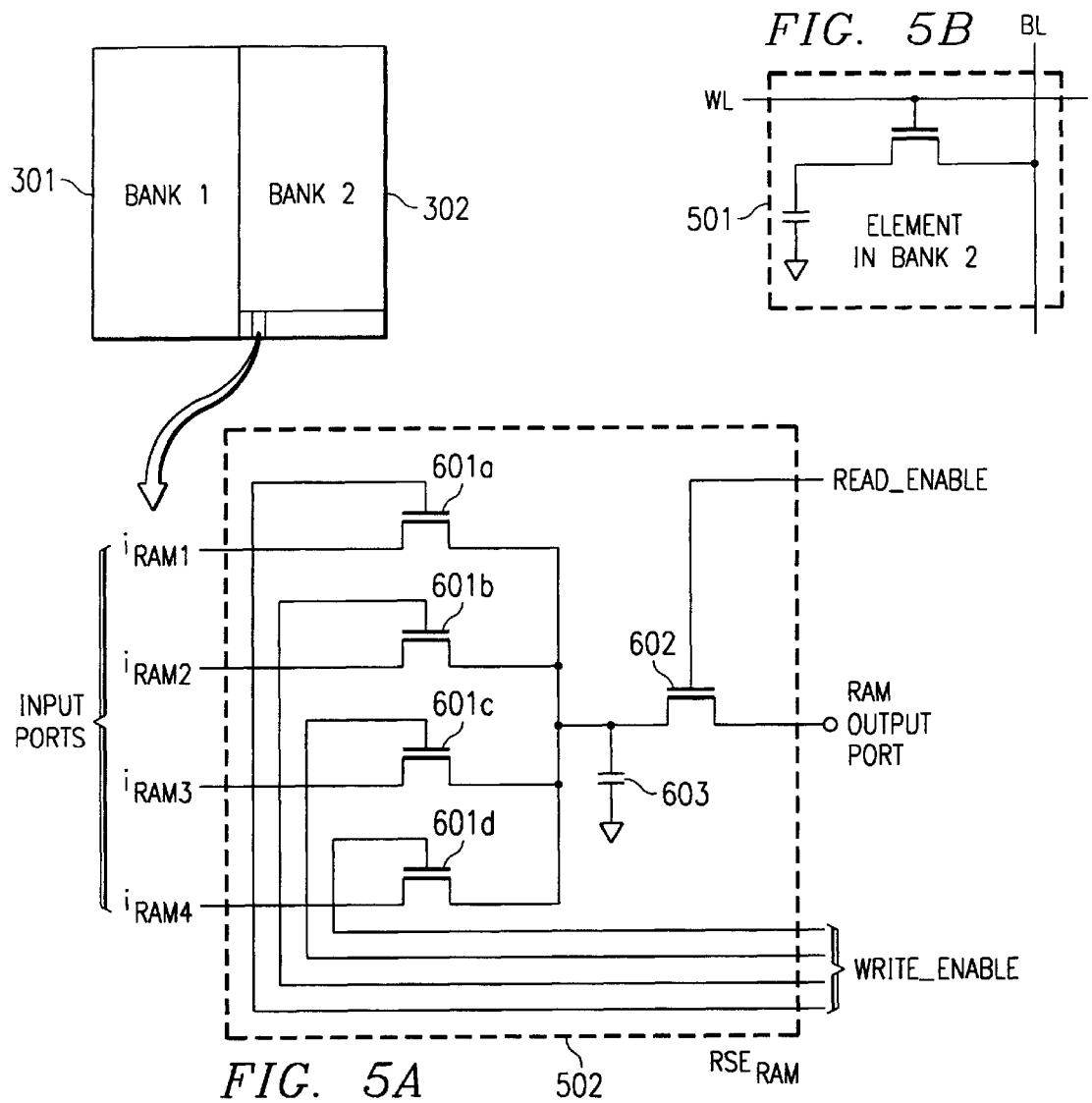
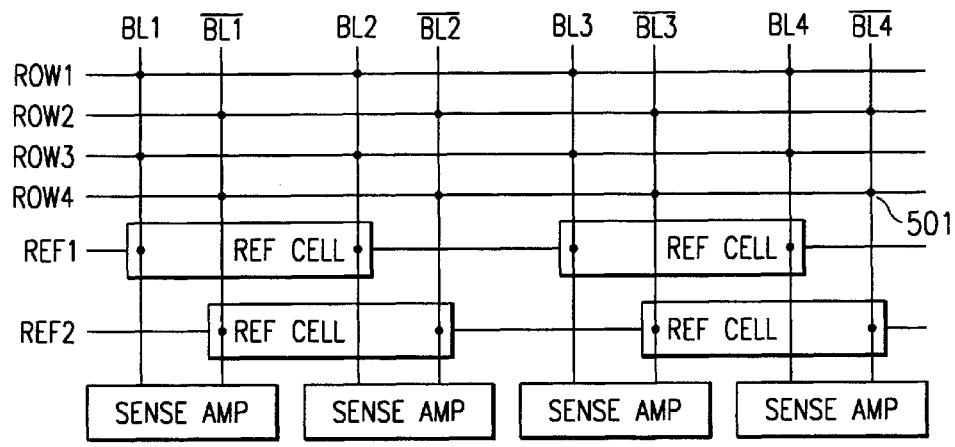
FIG. 5A
FIG. 5B
FIG. 5C

HIGHLY EFFICIENT DESIGN OF STORAGE ARRAY FOR USE IN FIRST AND SECOND CACHE SPACES AND MEMORY SUBSYSTEMS

FIELD OF INVENTION

The present invention relates in general to electronic storage devices and systems and in particular to methods and circuits suitable for use in the design and construction of efficient caches for use in microprocessors and microprocessor-based systems.

BACKGROUND OF INVENTION

In a basic microprocessor-based system, a single microprocessor acts as the bus controller/system master. Typically, this microprocessor includes on-chip cache for storing both instructions and data. In embedded chip controllers, as well as some microprocessor-base architectures, at least some of the data cache, instruction cache, or both can reside off-chip. In any event, the cache is a high-speed (shorter access time) memory, which makes up the higher levels in the memory hierarchy and is used to reduce the memory access time and supplement the processor register space.

Generally, the processor first attempts to access cache to retrieve the instructions or data required for a given operation. If these data or instructions have already been loaded into cache, then a "cache hit" occurs and the access is performed at the shorter cache access time. If the necessary data or instructions are not encached, a "cache miss" occurs and processor must redirect the access to system memory or some other lower-speed memory resource. The cache is then updated by replacing selected existing encached data with the data retrieved from the lower levels. Various caching techniques are used to reduce the miss penalty and execution errors in the processor pipelines when a cache miss does occur.

Hence, cache performance improvement centers on three basic optimizations: (1) reducing the miss rate; (2) reducing the miss penalty on a cache miss; and (3) reducing the time access cache on a hit. Given the importance of caching in the design and construction in high performance processing systems, circuits and methods which effectuate any or all of these optimizations would be distinctly advantageous.

SUMMARY

The principles of the present invention are embodied in systems and methods for of operating a memory subsystem. According to one such method, a set of data are stored in a first space in a cache memory, a set of data associated with the set of tags. The subset of the set of data is then stored in a second space in the cache memory, the subset associated with a tag which is a subset of the set of tags associated with the data in the first space. A tag portion of an address is compared with the tag associated with the subset of data in the second space in cache memory and the subset of data in the second space is read when the tagged portion of the address and the tag associated with the subset of data match. The tagged portion of the address is also compared with the set of tags associated with the set of data in the first space in cache memory. The set of data in the first space is read when the tag portion of the address matches one of the set of tags associated with the set of data in the first space and a tagged portion of the address and the tag associated with the subset of data in the second space do not match.

Methods and systems embodying the inventive concepts will allow for significant improvement in memory system performance. Among other things, cache memory performance is improved through a reduction in the miss rate, a reduction of the missed penalty on a cache miss and/or a reduction in the access time on a cache hit.

BRIEF DESCRIPTION OF DRAWINGS

FIG. 5*a* illustrates the instance in which the mirrored storage array can be implemented with a DRAM memory element, that are either symmetric or asymmetric;

FIG. 5*b* illustrates a typical 1T1C cell structure;

FIG. 5C illustrates a portion of the array row and column and sense amplifier organization;

DESCRIPTION OF THE PREFERRED EMBODIMENT

Figure 1:
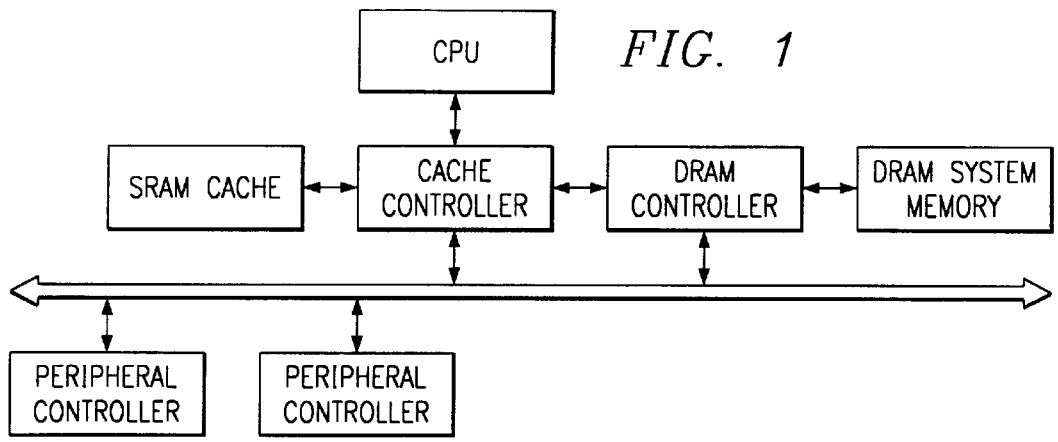
FIG. 1 is a high level functional block diagram of an exemplary basic computer architecture based on a microprocessor system master and a system bus.

FIG. 1 is a high level functional block diagram of an exemplary basic computer architecture 100 based on a microprocessor (CPU) 101 system master and a system bus 102. This system includes a block of off-chip (external, Level Two, or L2) SRAM cache 103 for encaching instructions or data. CPU 101 communicates with cache 103 through a conventional cache controller 104. CPU 101, as well as a number of peripheral devices 105 operating from system bus 102, operate in conjunction with a DRAM system memory 106 through a conventional DRAM controller 107. The peripherals could include, for example, a display controller, bus bridge, disk drive controller, or the like.

Figure 2:
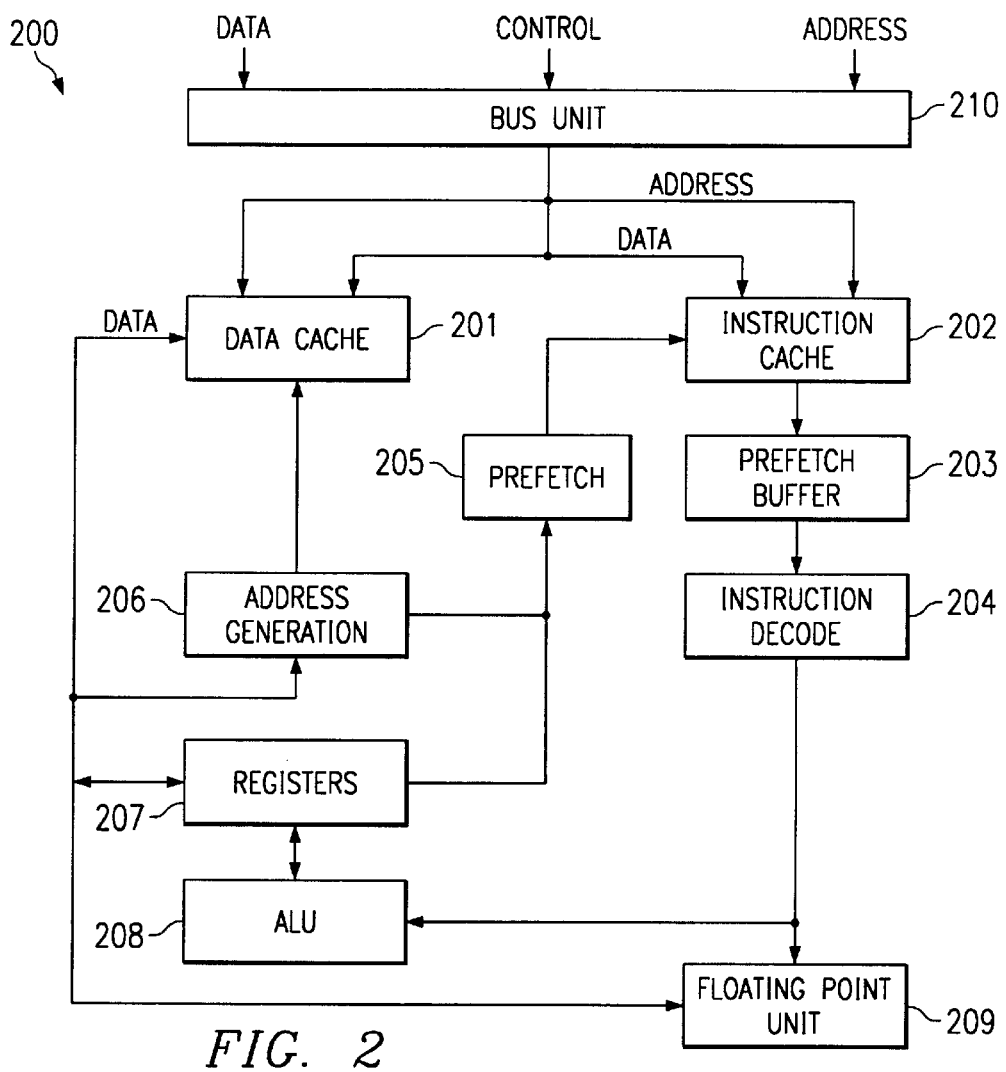
FIG. 2 illustrates the CPU on-chip (L1) data and instruction (code) cache of the exemplary generic microprocessor architecture.

The CPU on-chip (L1) data and instruction (code) cache are shown respectively by blocks 201 and 202 of the exemplary generic microprocessor architecture 200 shown in FIG. 2. The instruction pipeline includes conventional prefetch buffers 203, instruction decoders 204 and prefetch control circuitry 205. Data cache 201 is associated with address generators 206. The processing path includes registers 207, ALU 208 and floating point unit 209. Data, addresses and control signals are exchanged with CPU-external devices through bus unit 210.

Cache memory is accessed in blocks, with each block placed into locations in the cache as a function of the addressing/translating scheme employed in the design. For example, in a fully associative cache scheme, a block of instructions or data can be placed anywhere within the cache. An intermediate, and more common, cache organization is the set-associative cache where the block is first mapped to a set of locations in cache and then further mapped to any location within that set. In a direct mapped system, the block can be mapped only one cache location.

The processor or cache controller in a set-associative or direct-mapped cache system generates an address including a block address composed of a tag and an index, along with a block offset. The index selects the set. The tag is then compared against similar tags associated with the blocks of data in the indexed set. If a match (hit) occurs, the block offset is used to access a location in the matching block.

On a cache miss, a block or cache line must be replaced with the desired data. Two techniques are commonly employed in cache line or block replacement, namely Random and Least Recently Used (LRU). LRU is more commonly found state of the art memory subsystems and cache systems, although it is more complex to implement and reaches the point of diminishing returns as the associativity increases.

Most of the instructions in a general program are loads (reads) which access data from the memory subsystem. Typically, a smaller number of instructions are stores (writes) to memory, although this number may change as a function of the given application. One advantage of this asymmetrical memory operation is that reads are generally faster than writes. Specifically, during a read, the block can be read out concurrent with the tag comparison. If a hit occurs, the data can be immediately sent to the processor, otherwise, on a miss, the accessed data is simply discarded. However, a write cannot take place to a given block until a hit is confirmed in order to avoid overwriting necessary existing data. On a write several techniques are employed, the most common of which are, Write-Through and Write-Back, which protect against undesirable overwrites.

Moreover, during a write operation to lower levels on memory, the CPU must wait such that coherency is maintained in the data being fetched. In other words, if a given instruction operates on data that was modified by the execution of a previous instruction, the CPU must wait for the memory to be updated before accessing that data again. This requires temporal locality of the data needed for a series of instructions being executed and is most likely to occur in programs where a list is being ordered, or several values of a particular variable are being computed and constantly updated for use in the next cycle.

A second scenario that is likely to occur in the course of instruction execution is due to the spatial locality of the data being requested for instruction execution. If the instructions being executed require data that have a constant address offset, then large blocks of data can be prefetched from the lower level of memory to the higher levels of the memory subsystem. This in turn reduces the probability of misses in the higher level in the memory hierarchy.

To avoid further stalls on writes, several common techniques are employed in the processor memory subsystem design including Write Allocate and No-Write Allocate. To write to various lower levels memory techniques mentioned above and buffers such as a Store Accumulator are used.

Various techniques that used to deliver performance in each of the categories discussed above, as well as the performance tradeoffs, are summarized below:

1. Miss Rate reduction Techniques
   Larger Block Size: Increases Miss Penalty, Decreases Miss Rate
   Higher Associativity: Increases Hit Time, Decreases Miss Rate
   Victim Caches: Reduces Conflict Misses
   Pseudo Associative Caches: Does not reduce total Miss penalty but reduces probability to access main memory
   Prefetching of Data and Instructions: Takes advantage of Spatial locality of data, harder to implement adds complexity to systems (TLB and BTB are part of the prefetching mechanism) can be done either by the compiler or with hardware
   Compiler optimizations: Loop fusion, Loop interchange, Merging arrays, Blocking etc.
2. Miss Penalty Reduction Techniques
   Giving priority to read misses over writes
   Sub-Block Placement for reduced miss penalty
   Early restart and Critical Word first
   Non Blocking Cache to reduce stalls on misses
   Multilevel caches
3. Hit time Reduction
   Small and Simple Caches
   No Address translation in cache indexing
   Pipelining writes Most of these techniques require making tradeoffs to optimize system performance for the average or the most common case. Therefore, the principles of the present invention present a design of a memory subsystem that can be used as a cache or a lower level memory subsystem, and which dynamically implements any or all of the aforementioned techniques in hardware concurrently. Additionally, these principles allow for the design of low cost high performance memory subsystems which optimize their organization based on the application specific instruction set. In particular, a cache and memory subsystem design is provided which is applicable in a general purpose memory subsystem, including multiprocessor-based systems, network processors and shared memory switches.

Figure 3:
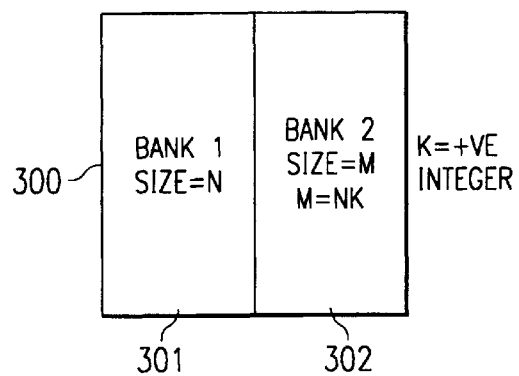
FIG. 3 shows a two bank mirrored cache/memory subsystem according to the principles of the present invention.

A two bank mirrored cache/memory subsystem (300) according to the principles of the present invention is shown in FIG. 3. In this embodiment, the memory is divided into two logical banks, Bank 1 (301) and Bank 2.

The size of Bank 2 (302) is preferably an integer multiple of Bank 1 (302). Thus if subsystem 300 is implemented as a 256 KBytes subsystem, then Bank 1 can be designed to be of size 64 Kbytes and Bank 2 can be designed with a size of 192 Kbytes. In this case, Bank 2 is 3 times the size of Bank 1. For the purposes of the description of this embodiment, the parameters to be used are: If Bank 2 is of size M then Bank 1 is of size N where, M=N*K and K is a positive integer.

Bank 1 is designed to store a subset of the data elements that are stored in Bank 2. In the preferred embodiment described herein, Bank 2 contains the latest data that are being fetched or written into memory subsystem discussed below. Bank 1 contains data that are always updated from Bank 2, such that the data in Bank 2 is always more recent by a time unit compared to the data in Bank 1.

If the block size is b Bytes then Bank 1 will contain N/b lines and Bank 2 will contain M/b lines. To identify the unique line within a bank, a tag directory or lookup table entry for Bank 1 will contain N/b entries of size $\text{Log}_2$ (b) bits each. Similarly, a tag directory or lookup table entry to identifies a unique line within Bank 2 that contains M/b= K*N/b entries of size $Log_2$ (b) bits each.

Figure 4:
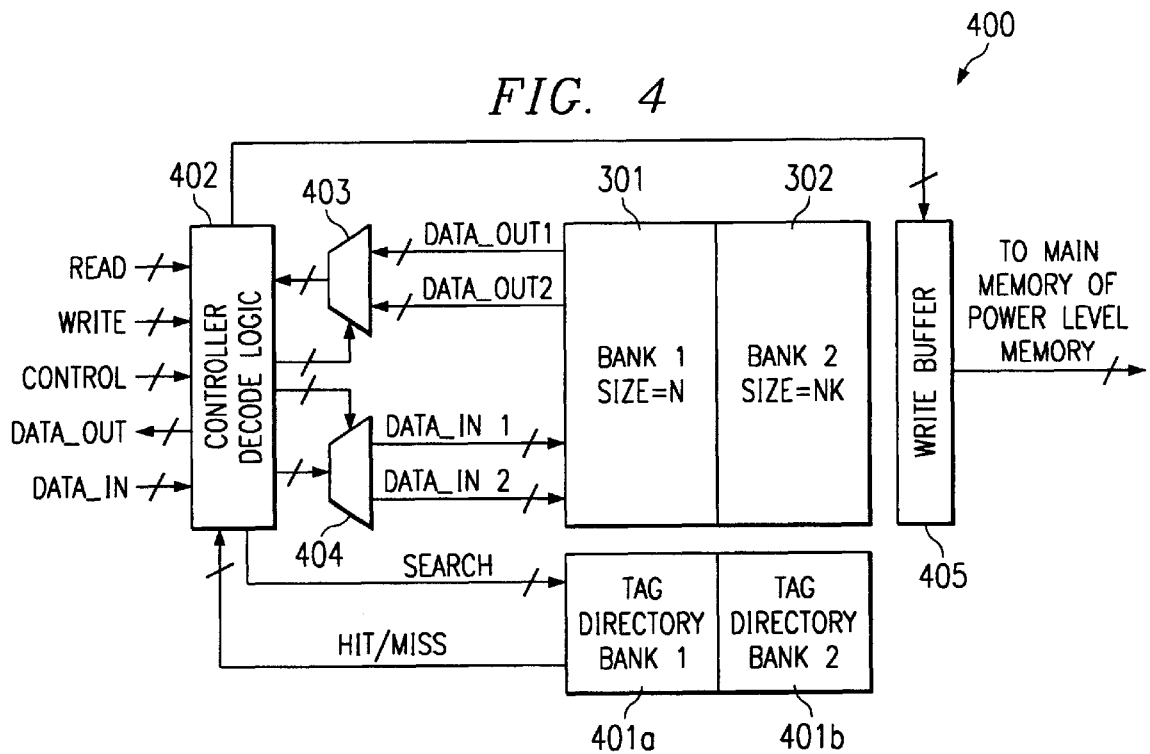
FIG. 4 illustrates the case in which the memory subsystem architecture contains the elements, mirrored storage array, with two banks, Bank 1 and Bank 2, lookup tables (tag directories), controller/decode logic and additional decode circuitry, such as Multiplexer and Demultiplexer, and a write buffer.

With respect to FIG. 4, the memory subsystem architecture 400 contains the following elements, the mirrored storage array (300), with two banks, Bank 1 (301) and Bank 2 (302), lookup tables (401a and 401b) (tag directories), controller/decode logic (402) and additional decode circuitry, such as Multiplexer (403) and Demultiplexer (404), and a write buffer (405).

Figure 5D:
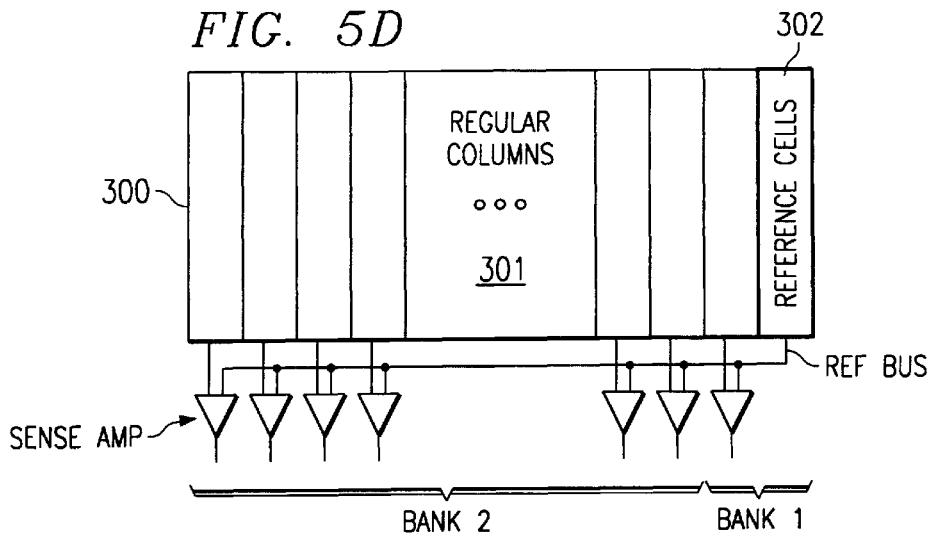
FIG. 5D illustrates the bank organization.

With respect to FIG. 5a, the mirrored storage array (300) can be implemented with a DRAM memory element, that are either symmetric or asymmetric. The use of symmetric memory elements facilitates the use of the mirrored storage array design in memories, the asymmetric elements can be used when multi-ported bit storage elements are required for the use of such a mirrored element as part of a switching subsystem. The storage array for embodiments using 1T1C DRAM elements 501 shown in FIGS. 5B–5D. Specifically, FIG. 5B illustrates a typical 1T1C cell structure, FIG. 5C a portion of the array row and column and sense amplifier organization and FIG. 5D the bank organization.

Figure 6A:
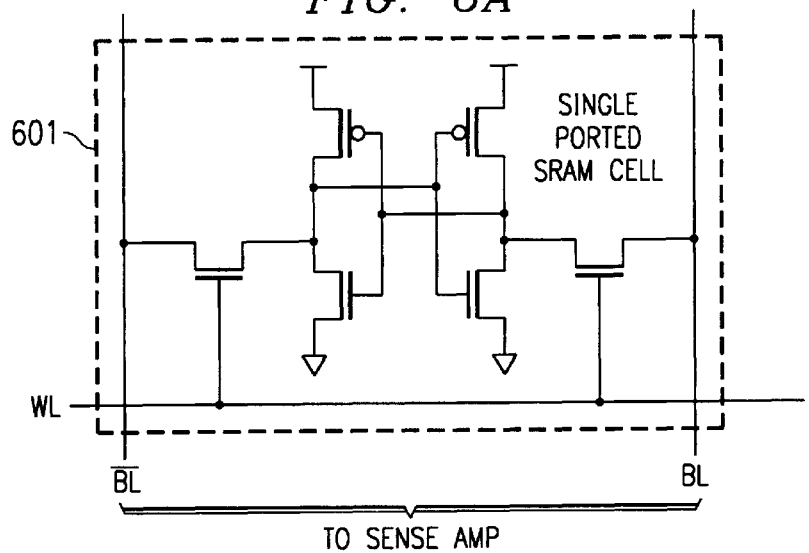
FIG. 6*a* illustrates the mirrored storage array which also can be implemented with a single-ported SRAM memory element that is symmetric or asymmetric.
Figure 6B:
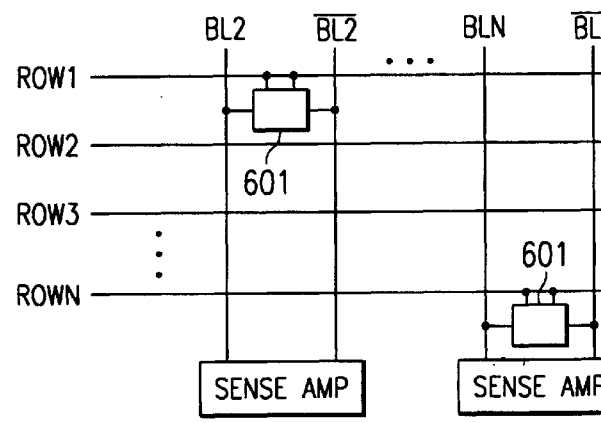
FIG. 6B shows a portion of an array implementation with a symmetric 1 bit single ported SRAM element.

With respect to FIG. 6a, the mirrored storage array also can be implemented with a single-ported SRAM memory element 601 that is symmetric or asymmetric. FIG. 6B shows a portion of an array implementation with a symmetric 1 bit single ported SRAM element (60).

Figure 7:
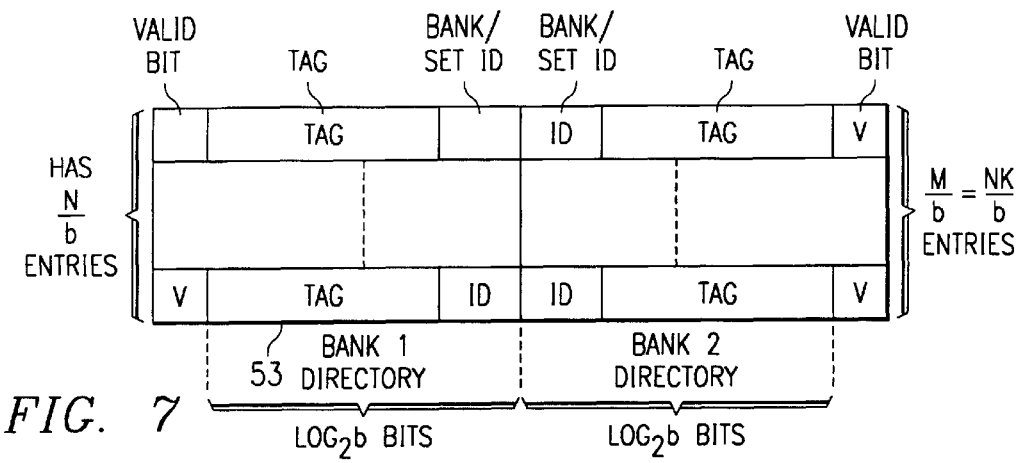
FIG. 7 illustrates the lookup tables having the logical structure.

The lookup tables (401) preferably have the logical structure as shown in FIG. 7. The lookup tables can be constructed of DRAM, SRAM or even flash memory elements. The fields are Tag and the corresponding Bank Number. In some cases the Tag field can be further broken down into index (BnkSet ID) and Tag fields for use in a two-stage search, where the set is located and then the index field identifies the sub-block within the set. The offset from the address is used to identify the byte within the sub-block. The size of the Tag field is then $Log_2$ (b) bits. There is a single bit in the lookup table entry, this bit is called the valid bit. The value of the valid bit indicates if the data in that particular cache line has been updated or corrupted. If the valid bit is "set" then the line is assumed to be "clean" or usable, otherwise the entry is deemed "Dirty"

A read by the processor or a higher-level memory subsystem can take place from either of the physically partitioned banks 301 or 302. Writes however only effect the data in Bank 2, i.e. writes by the processor or a higher level of memory subsystem can happen only to Bank 2.

In case of a read request from the external source the following possibilities arise:
1. Read request→Search Bank 1 (Check Tag and Valid bit)→Causes a Hit→Write the data back to the requesting entity (processor or higher level memory subsystem)
2. Read request→Search Bank 1 (Check Tag and Valid bit)→Causes a Miss→Search Bank 2 (Check Tag and Valid bit)→Causes a Hit→Write back data to requesting entity (processor or higher level memory subsystem)
3. Read request→Search Bank 1 (Check Tag and Valid bit)→Causes a Miss→Search Bank 2 (Check Tag and Valid bit)→Causes a Miss→Go system memory, hard or floppy drive, or similar memory resource to lower level storage in the memory hierarchy If hardware prefetching is employed, as in the case of burst reads from the main memory, mirrored storage array 300 is employed as part of the cache subsystem (higher level or lower level). In this embodiment, the mirrored storage array is used as part of an on-chip processor cache (L1) or discrete Level Two (L2) cache. Mirrored array 300 also may be employed in a main memory of a microprocessor-based system without departing from the nature of this invention.

A linear prefetching scheme can be employed where data are fetched from a lower memory level at address 'A' on a read miss, followed data or blocks of data from address 'A−1' and address 'A+1' as well. In this case, a data word or block from address 'A' is written into both Bank 1 and Bank 2 at the same time. A write involves the update of the Tags for both Bank 1 and Bank 2 in the Tag directory maintained in the lookup tables (401a,b). The valid bits for Tag entries in both banks are "Set" at this point. This indicates that there is valid data in Bank 1 and Bank 2 from Address 'A.'

Figure 8:
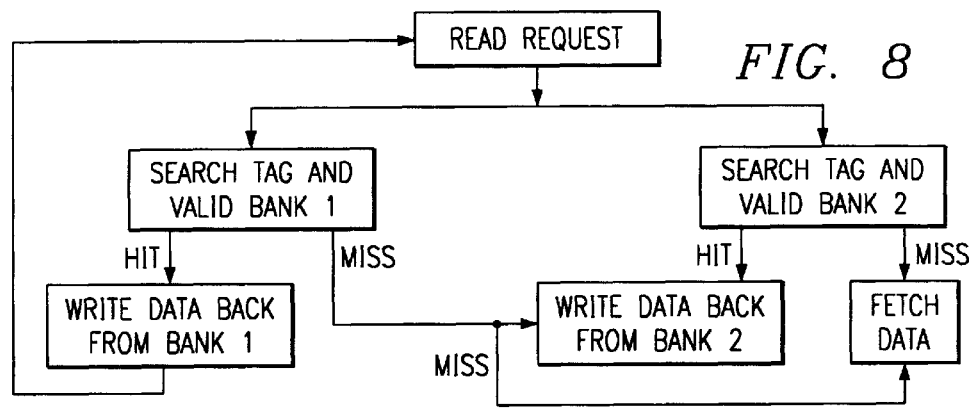
FIG. 8 illustrates a preferred READ protocol for a linear prefetching scheme.

A preferred READ protocol for a linear prefetching scheme is shown in FIG. 8. Data from Address 'A+1,' and Address 'A−1' are written into Bank 2 after the initial write from address 'A,' to both Bank 1 and Bank 2. The group of addresses A, A+1 and A−1 forms a "Set" The Tags corresponding to these addresses are stored in the tag directories 401a,b. The location to which data is written is determined by the position indicated by the memory write pointer in each of the Banks 301 and 302. This is a function of the controlling device. The memory write pointer in initialized to entry 2 at the time of the first data fetch. That means that data from address A are written into line 2 in Bank 2, the data from address A−1 are written into line 1 of Bank 2 and the data from address A+1 are written into line 3 of Bank 2. Each time data is written into Bank 2 the write pointer for Bank 2 is updated by 3, this prevents the overwriting of the address A and A+1 from the previous memory access cycle.

When the pointer reaches the end of Bank 2, i.e. line M/b−1, then the write pointer wraps around to line 2 again. This allows implementation of a pseudo-LRU where the oldest copy of data is always overwritten. There is a write buffer (#) that is provided in the memory subsystem. This write corresponds to write in Bank 1 at the location determined by the formula:

Bank 1 write pointer/location=[{(Memory Write Pointer for Bank 2−2)/K}+1]

This formula determines the associativity between Bank 1 and Bank 2, where Bank 1 is K-way set associative. It must be noted however that Bank 1 and Bank 2 are fully independent direct mapped associative caches. The associativity between Bank 1 and Bank 2 can be changed by employing a different prefetching scheme, (which in turn changes the formula for calculation of Bank 1 write pointer from the Bank 2 write pointer.)

Figure 9:
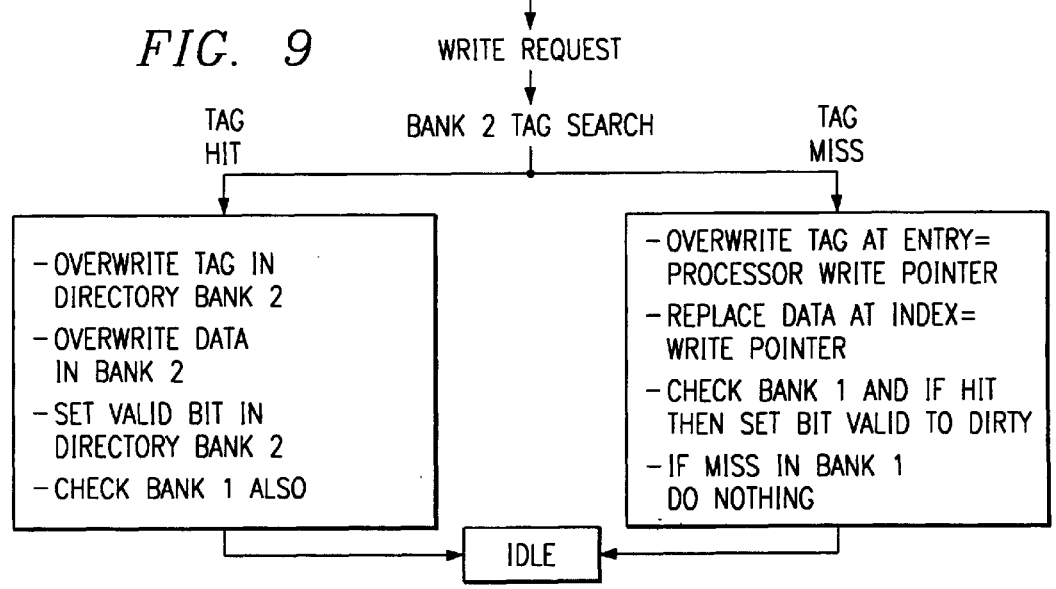
FIG. 9 illustrates the WRITE protocol used by the controller.

The controller also runs the protocol responsible for the write to a cache. The WRITE protocol used by the controller is shown in FIG. 9. In the first write scenario:
1) Processor Write→Bank 2 Search (Tag Search)→Tag Hit→Overwrite the Tag that matches with the same Tag in the Tag directory for Bank 2 and "Set" the valid bit. Overwrite the data corresponding to the Tag entry in Bank 2.

To maintain coherency of data, Bank 1 is also searched and the valid bit is changed to "Dirty" if there is a Tag hit in the Tag directory for Bank 1. The data are not overwritten such that the entry at the line number corresponding to this Tag value is free to be overwritten in the next write cycle from a lower level memory prefetch, fetch, or an update from Bank 2. The processor write pointer, which is separate from a memory write pointer, is not updated and points to the line with first "Dirty" valid bit in Bank 2, or the first line in Bank 2, otherwise if no Dirty bit is set. On the first Tag hit on a processor write, and on subsequent processor writes, the processor write pointer gets updated by 2, so as not to overwrite data from Address 'A.'

The processor write pointer is only used as a replacement instrument in case of a Tag miss as shown in scenario 2:

2) Processor Write→Bank 2 Search (Tag Search)→Tag Miss→Overwrite Tag entry in Tag directory for Bank 2 at the index that will be equal to the processor write pointer with new address Tag generated by the processor. Replace the data in the line that corresponds to the index of the processor write pointer. To avoid coherency problems check the Bank 1 Tags in the Tag directory entries for Bank 1. (Since there might be a Tag match in Bank 1 even though there is Tag miss in Bank 2 this step is necessary.) If there is a Tag hit in the Tag directory for Bank 1 then set the valid bit to "Dirty" If there is no match then the directory entries for Bank 1 are left unchanged.

The selection of two pointers for memory and processor writes allows the application or the instruction set associated with it to dynamically determine the data distribution within this memory subsystem. This allows for dynamic utilization of spatial and temporal locality of data.

If the processor accesses more recently written data from memory it is more likely that these reads will generate hits in Bank 2. If the accesses are more Random, it is likely more hits will be generated in Bank 1. The underlying assumption is that there is some degree of spatial locality associated with instruction and data for all applications.

This design of the cache is that it offers the advantage of a direct mapped cache on the writes and the speed of associativity on the reads. The independent processor write pointer can also be updated using a method where it always points to the first "Dirty" line in the Bank.

In sum, the mirrored memory architecture of the present invention can advantageously be used to maintain the spatial and/or temporal locality of the encached data required for a set of processing operations. Specifically, a set of data and the corresponding tags are stored in the Bank 2 and associated Bank 2 directory respectively. A subset of those data are stored, along with the corresponding tags, in the Bank 1 and associated Bank 1 directory. When a memory address is received, from the CPU or memory controller, the tag is first compared with those in the tag directories. If a hit is found in the Bank 1 tag directory, the Bank 1 of the mirrored memory is preferentially accessed. Otherwise, if address tag misses the Bank 1 directory but hits an entry in the Bank 2 directory, the Bank 2 is used for the access. When the address tag does not match a tag in either of the two directories, then a lower level of memory must be accessed and the mirrored memory contents updated.

During update of the mirrored memory contents on a read miss, a block or other set of data associated with a set of addresses are copied into the Bank 2 of the mirrored memory and the associated tags loaded into the Bank 2 directory. A subset of this block of data, having a tag matching that of the address causing the miss, is also loaded into the Bank 1 and that tag loaded into the corresponding entry in the Bank 1 directory. On a write miss, a victim line or block at the write pointer is overwritten and the corresponding entry in the Bank 2 directory updated with the tag from the address causing the miss.

While a particular embodiment of the invention has been shown and described, it will be obvious to those skilled in the art that changes and modifications may be made therein without departing from the invention in it's broader aspects, and, therefore, the aim in the appended claims is to cover all such changes and modifications as fall within the true scope of the invention.

What is claimed is:

1. A method of operating a cache memory comprising the steps of:
    storing a set of data in a first space in the cache memory, the set of data associated with a set of tags;
    storing a subset of the set of data in a second space in the cache memory and associated with a tag, the tag associated with the subset of data being a subset of the set of tags;
    comparing a tag portion of an address with the tag associated with the subset of data in the second space in the cache memory;
    reading the subset of data in the second space when the tag portion of the address and the tag associated with the subset of data match;
    comparing the tag portion of the address with the set of tags associated with the set of data in the first space in the cache memory; and
    reading the set of data in the first space when the tag portion of the address matches one of the set of tags associated with the set of data in the first space and the tag portion of the address and the tag associated with the subset of data in the second space do not match.

2. The method of claim 1 further comprising the steps of:
    when the tag portion of the address matches does not match one of the set of tags associated with the set of data in the first space, storing a second set of data in the first space in cache memory and associated with a second set of tags, the second set of data including a second subset of data associated with a tag matching the tag portion of the address; and
    storing the second subset of data in the second space in the cache memory tagged with the tag matching the tag portion of the address.

3. The method of claim 1 further comprising the steps of:
    during a write operation, comparing the tag portion of the write address with the set of tags associated with the set of data in the first memory space; and
    if the tag portion of the write address matches one of the set of tags associated with the set of data in the first memory space, overwriting the data in the first memory space associated with the matching tag.

4. The method of claim 3 and further comprising the steps of:
    if the tag portion of the write address does not match one of the set of tags associated with the set of data in the first space in the cache memory, retrieving the data associated with the tag portion of the write address from a second memory; and
    storing the retrieved data in the first space of the cache memory tagged with a tag corresponding to the tag portion of the write address.

5. The method of claim 2 wherein said step of storing the second set of data in the first space in the cache memory comprises the step of storing the second set of data in a least recently used set of locations in the first space.

6. The method of claim 2 wherein said step of storing the second set of data in the first space in the cache memory comprises the step of storing the second set of data in a randomly selected set of locations in the first space.

7. The method of claim 4 wherein said step of storing the retrieved data comprises the step of storing the retrieved data at a least recently used set of locations in the first space.

8. The method of claim 4 wherein said step of storing the retrieved data comprises the step of storing the retrieved data at a randomly selected set of locations in the first space.

9. A processing system comprising:

a system memory;

a cache memory comprising first and second peer cache memory spaces;

a first table for storing tags associated with data stored in the first cache memory space;

a second table for storing tags associated with data stored in the second cache memory space;

processing circuitry operable to:

access a plurality of blocks of data from said system memory in response to a plurality of addresses;

store said blocks of data accessed from said system memory within said first cache memory space, said blocks of data associated with a set of tags in said first table;

store a selected block of said blocks of data accessed from said system memory within said second cache memory space, and said block associated with a tag in said second table;

generate a read address including a tag field;

compare said tag field of said read address with said tag in said second table associated with said selected block and access said selected block from said second cache memory space when said tag field and said tag in said second table match; and compare said tag field of said read address with said set of tags in said first table when said tag field and said tag in said second table do not match and access a corresponding block in said first cache memory space when said tag field and a tag in said first table match.

10. The processing system of claim 9 wherein said processing circuitry is further operable when said tag field does not match a tag in the first table to:

retrieve a second plurality of blocks of data from said system memory;

store the second plurality of blocks of data in the first cache memory space, the second plurality of blocks associated with a second set of tags in said first table; and store a second selected block of the second plurality of blocks in said second cache memory space, said second selected block associated with a second tag in said second table matching said tag field of said address.

11. The processing system of claim 9 wherein said processing circuitry is further operable to:

generate a write address including a tag field;

compare said tag field of said write address with the set of tags in the first table; and overwrite data in the first memory space associated with a corresponding tag in the first table matching said tag field of said write address.associated with a set of tags;

storing a subset of the set of data in a second space in the cache memory and associated with a tag, the tag associated with the subset of data being a subset of the set of tags;

comparing a tag portion of an address with the tag associated with the subset of data in the second space in the cache memory;

reading the subset of data in the second space when the tag portion of the address and the tag associated with the subset of data match;

comparing the tag portion of the address with the set of tags associated with the set of data in the first space in the cache memory; and reading the set of data in the first space when the tag portion of the address matches one of the set of tags associated with the set of data in the first space and the tag portion of the address and the tag associated with the subset of data in the second space do not match.

12. The processing system of claim 9 wherein said second cache memory space is smaller than said first cache memory space.

13. The processing system of claim 9 wherein said cache memory system comprise a discrete cache memory system.

14. The processing system of claim 9 wherein said cache memory system comprises an on-board cache memory system integrated with said processing circuitry.

15. The processing system of claim 9 wherein said processing circuitry comprises a central processing unit.

16. The processing system of claim 9 wherein said processing circuitry comprises a cache memory controller.

* * * * *